United States Patent [19]

Bellay et al.

[11] Patent Number: 4,545,038

[45] Date of Patent: Oct. 1, 1985

[54] PRECHARGED DISCHARGE SENSING FOR EPROM

[75] Inventors: Jeffrey D. Bellay; Robert C. Thaden, both of Houston, Tex.

[73] Assignee: Texas Instruments Incorporated, Dallas, Tex.

[21] Appl. No.: 365,823

[22] Filed: Apr. 5, 1982

[51] Int. Cl.[4] .............................................. G11C 11/40
[52] U.S. Cl. .................................. 365/230; 364/200; 365/189; 365/203; 365/226
[58] Field of Search ............... 365/184, 185, 203, 226, 365/189, 230; 364/200

[56] References Cited

U.S. PATENT DOCUMENTS

| 4,094,012 | 6/1978 | Perlegos et al. | 365/226 |
| 4,393,481 | 7/1983 | Owen et al. | 365/226 |

OTHER PUBLICATIONS

Hanafi, "Bit Line Discharge Circuit for NAND Logic Read-Only Storage Arrays", IBM Tech. Disc. Bul., vol. 23, No. 7B, 12/80, pp. 3181-3182.
Owen et al., "Voltage Generator for EPROMS", Electronic Product Design, 10/81, p. 28, 52007 0037.

Primary Examiner—Terrell W. Fears
Attorney, Agent, or Firm—Thomas E. Tyson; Leo N. Heiting; Melvin Sharp

[57] ABSTRACT

An electrically programmable read-only memory including a memory array of several bits capable of storing binary data connected to an address circuit for accepting a plurality of bits that designate a selected set of the memory array bits and further connected to a data latch to store data to be programmed in a selected set of memory bits. Further provided is a high voltage circuit for providing a high voltage to the selected set of bits according to the data in the data latch and for programming the data in the selected set of memory array bits. Further provided is an output circuit to provide a precharge signal to the memory array bits and to output data programmed in a selected set of memory array bits designated by the address circuit.

4 Claims, 22 Drawing Figures

PRECHARGED DISCHARGE SENSING FOR EPROM

BACKGROUND

1. Field of the Invention

This invention relates to semiconductor memory devices and more particularly to metal oxide silicon read-only memories of the electrically programmable type.

This invention relates to U.S. patent application Ser. No. 365,828 filed on Apr. 5, 1982.

2. Description of Prior Art

Floating type electrically programmable read-only memories or EPROMS are usually manufactured using cell layouts as seen in U.S. Pat. Nos. 4,112,509, and 4,112,544 issued to Wall and McElroy, assigned to Texas Instruments or in U.S. Pat. No. 3,984,822. Several manufacturers produced EPROM devices of layouts such as this in 8K, 16K, 32K and more recently 64K bit sizes. One of the classic techniques for increasing the array density and read-only type memories is the use of a virtual ground configuration instead of providing a ground line for each column or output line. Virtual ground memories are disclosed in U.S. Pat. No. 3,934,233 issued to Fisher and Rogers or U.S. Pat. No. 4,021,781, issued to E. R. Caudel, both assigned to Texas Instruments. A virtual ground ERPROM layout is shown in U.S. Pat. No. 4,151,021, issued to David J. McElroy, assigned to Texas Instruments. When addressed, the virtual ground EPROM output is in the milivolt range. Because of the small amount of output voltage, the sensing circuit must be extremely sensitive to the small changes in output voltage. As shown by the stated prior art, the sensing circuitry usually includes multiple stage differential amplifier in order to sense the small change in output voltage.

It is an object of this invention to provide an improved electrically programmable read-only memory device that has an output voltage of approximately 1 volt. It is a further object of this invention to provide electrically programmable memory device that employs a simplified sensing circuit.

SUMMARY

In accordance with the present invention, an electrically programmable read-only memory is provided that includes an array of memory containing several bits capable of storing binary data. This array is connected to an address circuit that in turn accepts a plurality of bits designating an address of a selected set of bits in the memory array. A data latch is provided to store the data to be programmed in a selected set of memory array bits designated by the address circuit. A high voltage circuit is also included for providing a high voltage to the selected set of data bits determined by the adddressing means to program these bits with the data contained in the data latch. An output circuit is provided to precharge the memory array and output the data of the selected set of memory array bits determined by the address circuit.

In the preferred embodiment, an electrically programmable read-only memory is provided that includes a memory array containing several memory bits for storing binary data. Connected to this memory array is an address circuit for accepting an address provided by some external device. The address is used to select a selected set of memory array bits. Further provided is a data latch that is coupled to the memory array. The data latch stores the data to be programmed in a selected set of memory array bits determined by the addressing means. A high voltage circuit is included for providing a high voltage to the selected set of data bits in order to program the data stored in the data latch into these bits. Lastly, an output circuit is provided to precharge the memory array bits and to output the data programmed the the selected set of memory array bits determined by the address circuit. In a further embodiment of this invention, a discharge circuit is provided to discharge any latent high voltage after the high voltage circuit has provided the programming charge. This discharge occurs before the output circuit precharges the memory array bits.

DETAILED DESCRIPTION OF THE PREFERRED EMBODIMENT

Figure 1A:
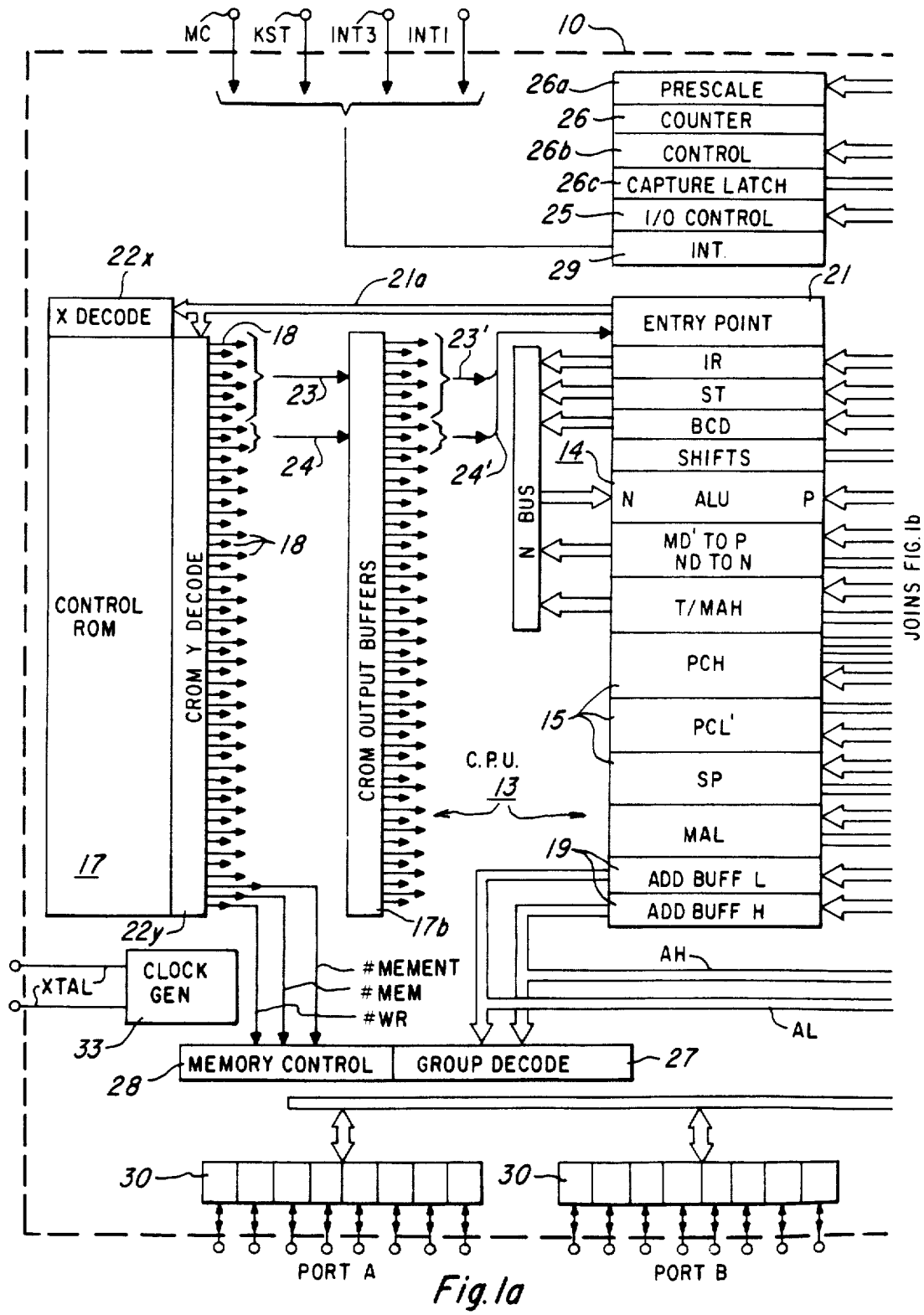
FIG. 1 made up of FIGS. 1a and 1b is a block diagram of the microcomputer chip.
Figure 1B:
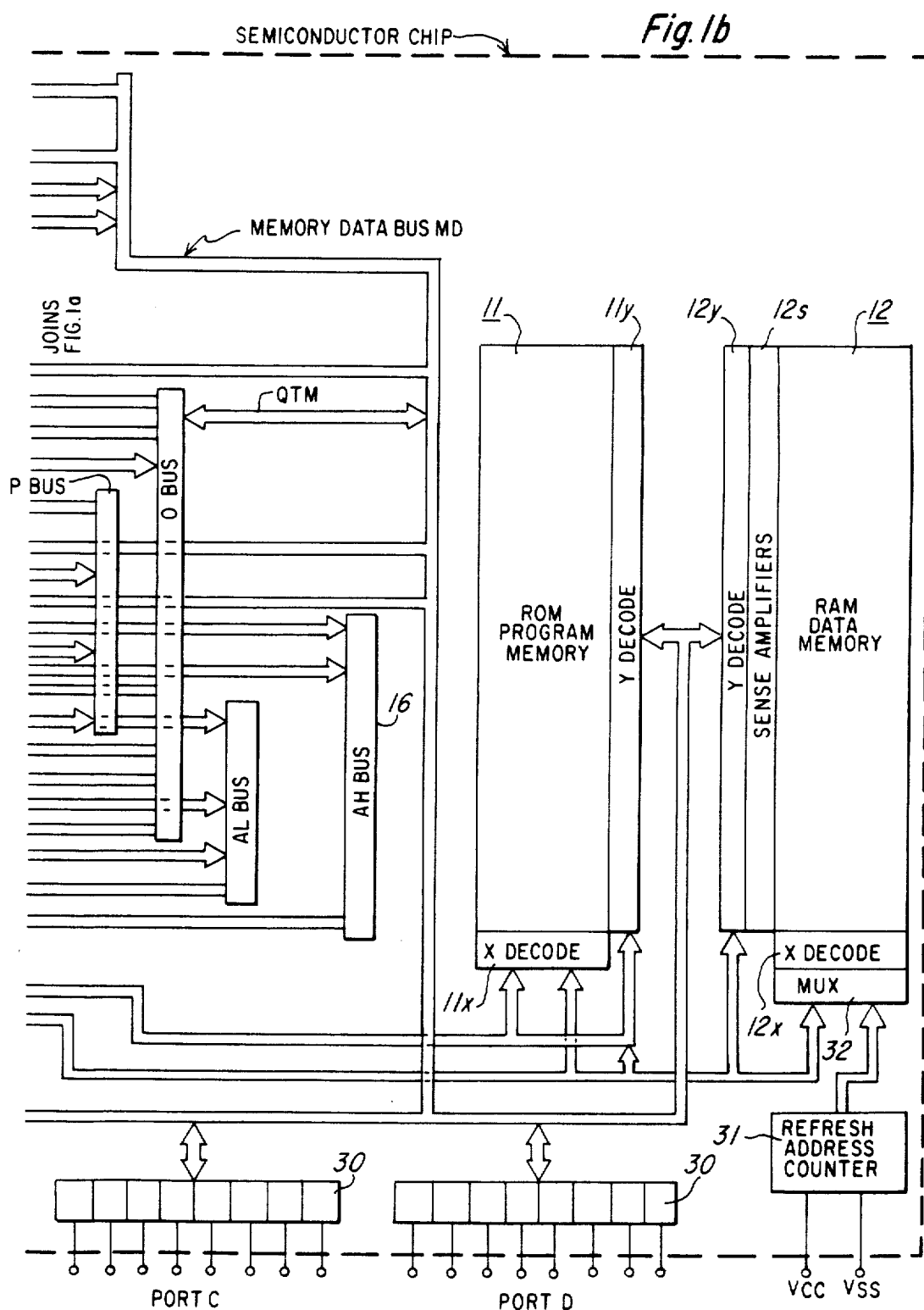

This invention is illustrated as applied to a single chip microcomputer. FIG. 1 is a block diagram illustrating the components of the microcomputer chip. A more detailed description of this microcomputer is contained in U.S. patent application Ser. No. 253,647 (TI-8625) which is herein incorporated by reference. The emphasis of this invention is on the ROM 11 program memory and the Y decode 11Y and X decode 11X. This ROM for the invention is an electrically programmed read-only memory (EPROM). The EPROM 11 is accessible via the X decode 11x and the Y decode 11y through the Memory Data Bus (MD). The MD bus is also connected to input and output ports, Port A, Port B, Port C and Port D 30 to interface with external devices. The EPROM 11 contains the program which is executed by the microcomputer.

This embodiment contins two distinct advantages over that of the prior art. The first is that the EPROM on board the chip may be programmed from either an external source or internally by the microcomputer itself. Secondly, the architecture of the EPROM itself allows for a simplified bit sensing circuit. The programming capability for the EPROM 11 includes two modes: the dumb mode and the macro mode. The dumb mode is so named because the microcomputer is disabled during the programming of the EPROM 11. In the dumb mode, external devices control the actual programming of this onboard EPROM 11. The EPROM 11 is programmed as if it were a standard EPROM device such as the 2516 to 2716. However, in the macro mode, the programming of the EPROM 11 is accomplished by the onboard microcomputer using a special microcode instruction dedicated to the writing of byte locations in the EPROM 11.

Figure 2:
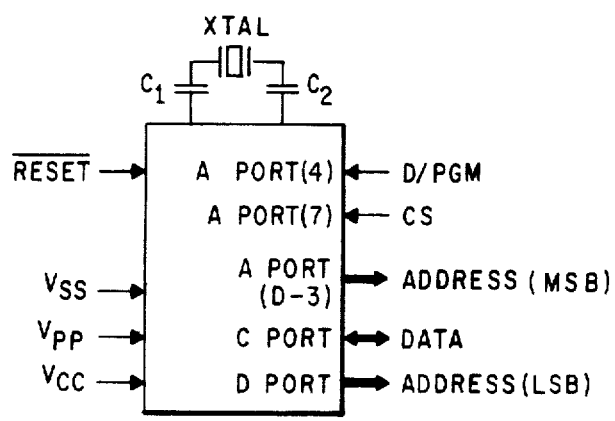
FIG. 2 is an interface diagram for the microcomputer in the dumb mode.

FIG. 2 illustrates the interface to the microcomputer required for the programming of this memory in the dumb mode. The Vss and Vcc are the power supply inputs for the microcomputer chip as before (5 volts). The Vpp is a 25 volt power input required for programming the EPROM bit locations. The RESET signal is used to put the microcomputer into the dumb mode. The crystal, C1 and C2 provide timing to the microcomputer. Two control signals are used in the programming of the internal EPROM. The first is PD/PGM which is the program command that is applied to A port position 7, A(7). This second is $\overline{CS}$ which is the chip select signal input to the 7th position of the A port A (4). The address of the memory location to be written is applied to the D port for the lower significant byte and A port for the 4 bits of the upper significant byte. The actual data is applied into the C port. The data can be verified after the memory write operation by using the C port to output the data at the memory address specified by port D and port A.

Figure 3:
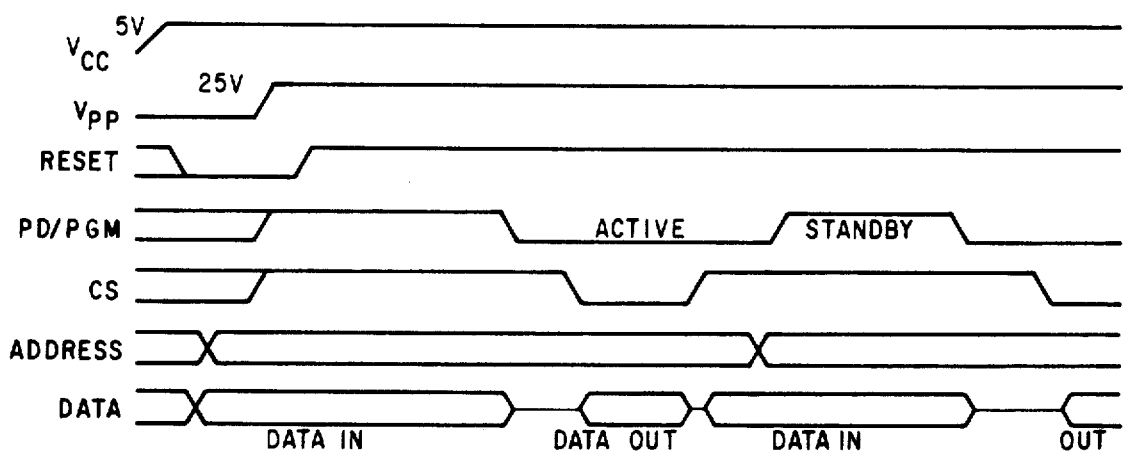
FIG. 3 is a timing diagram of the microcomputer in the dumb mode.

FIG. 3 illustrates the timing for the control signals, data, and address input into the microcomputer for the configuration illustrated in FIG. 2. The Vcc signal is set to 5 volts and at some later time, the Vpp is set to 25 volts during the down time of the $\overline{RESET}$ as shown. This signifies to the microcomputer that the microcomputer is to proceed in one of the two internal programming modes. The actual sequence required to place the microcompuer in the dumb mode is that when the $\overline{RESET}$ goes low, Vpp is applied and then A port position 4 (CS-) is set to a 1 level. When the $\overline{RESET}$ is returned high, the microcomputer will be in the dumb mode. In this mode, the microcomputer is programmed similar to the 2516/2716 EPROM. Addresses are applied to the D port and A port as shown by external circuits. The addresses may be continually applied to these ports in order to verify the data. During the verify sequence, the PD/PGM signal goes low and $\overline{CS}$ goes low. The address input into the D and A ports provides the address of the data that is then outputted from the C port. Resetting $\overline{RESET}$ and removing Vpp before reset becomes high will return the microcomputer to normal operation. If during the write sequence, Vpp goes low, the write will not be accomplished.

Figure 4:
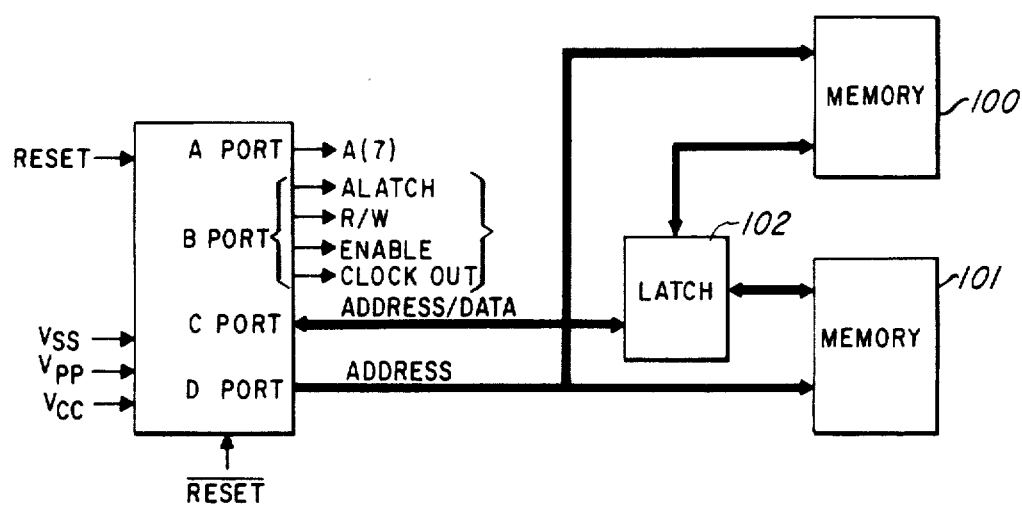
FIG. 4 is a block diagram of the microcomputer with peripherals in the micromode.

The interface required for the macro mode is illustrated in FIG. 4. To initiate macro mode Vcc is applied to the microcomputer and the $\overline{RESET}$ goes low, Vpp is applied and the A(7) pin is set to a zero level. When $\overline{RESET}$ returns high, the microcomputer will be in the macro mode where it will self-program the internal EPROM 11. In this mode the microcomputer is in a "memory expansion" external mode. That is, it is in a mode where it may access the memory of external devices as described in U.S. patent application Ser. No. 253,642 (TI-8625). The control signals of the B port provide the handshaking required to interact with external memory devices. ALATCH provides the address indicator signal, R/$\overline{W}$ is the read/write signal, ENABLE is the chip enable signal and CLOCKOUT is the output of the internal microcomputer clock. These signals are required by external devices in order to interface with the microcomputer. In other words, the microcomputer produces the control signals for this interface instead of some external device as in the dumb mode. In this memory expansion mode, the external memory device addresses are memory mapped ont the Memory Data bus as if they were an internal memory within the microcomputer chip. Therefore, the microcomputer can execute programs contained in any external devices as if it were contained internally. In this regard, the address to the memory device is outputted by the C port and D port to memory devices, 100 and 101. Memory device 100 is a typical memory device that contains the program to be executed by the microcomputer. The data in memory device 101 represents data that is to be loaded into the EPROM internal to the microcomputer. Latch 102 is a data latch such as a 74373 and is provided to latch the data for the microcomputer.

Figure 5A:
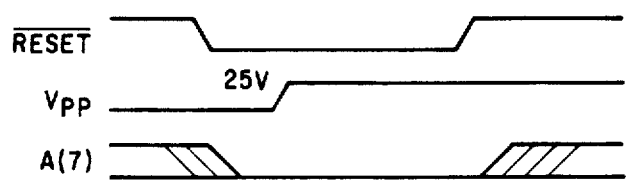
FIGS. 5a and 5b are a timing diagram for the microcomputer in macro mode.

The timing for the transfer of data between the memory devices 100 and 101 and the microcomputer is shown in FIG. 5a. As stated before, when the $\overline{RESET}$ goes low, Vpp is applied and a 0 level is applied to the 7th position of the A port, the microcomputer enters the macro mode. When the $\overline{RESET}$ goes high, the microcomputer is in the macro mode. In this mode, the microcomputer operates exactly like the microcomputer operates in normal mode, except that it now has a new instruction "PRG" (opcode 04). This instruction can be included along with any other microcomputer instructions within a program.

Figure 5B:

When the device is reset, the reset signal acts as an external interrupt and causes the program to be vectored to a location in memory where that memory location contains the address of the next instructions to be executed. In the macro mode the reset vector is fetched from the external memory address EFFE and EFFF instead of FFFE and FFFF because the EPROM memory has space F000 to FFFF (containing the normal reset vector position FFFE and FFFF) and is initially unprogrammed. This allows the microcomputer to program its own internal EPROM. If the microcomputer is reset without the Vpp (FIG. 5b) being, applied, then the microcomputer operates in the normal mode and the reset signal is fetched from its normal location FFFE and FFFF.

Vpp may be removed at any time while in the macro mode. This will simply cause the microcomputer to disable any writing into the EPROM. In the preferred embodiment, the PRG opcode is followed by a register file number of 1 byte. This number specifies a register pair that contains a 16 bit EPROM address F000 to FFFF to be programmed. The data that is to be written into this address is contained in the "A" register. This is simply an indirect addressing mode with the source data in the A register. In the preferred embodiment, the instruction takes approximately 26 miliseconds to execute. In order to insure that a valid write into the EPROM takes place, the "PRG" instruction must be executed two times. Since the "PRG" instruction can be included among any other microcomputer instructions, many special applications are made possible. For example, the microcomputer can be used in a smart terminal or control system in which special signatures, identification, or data are entered into the microcomputer upon initialization after the system has been installed in its final environment.

Figure 6:
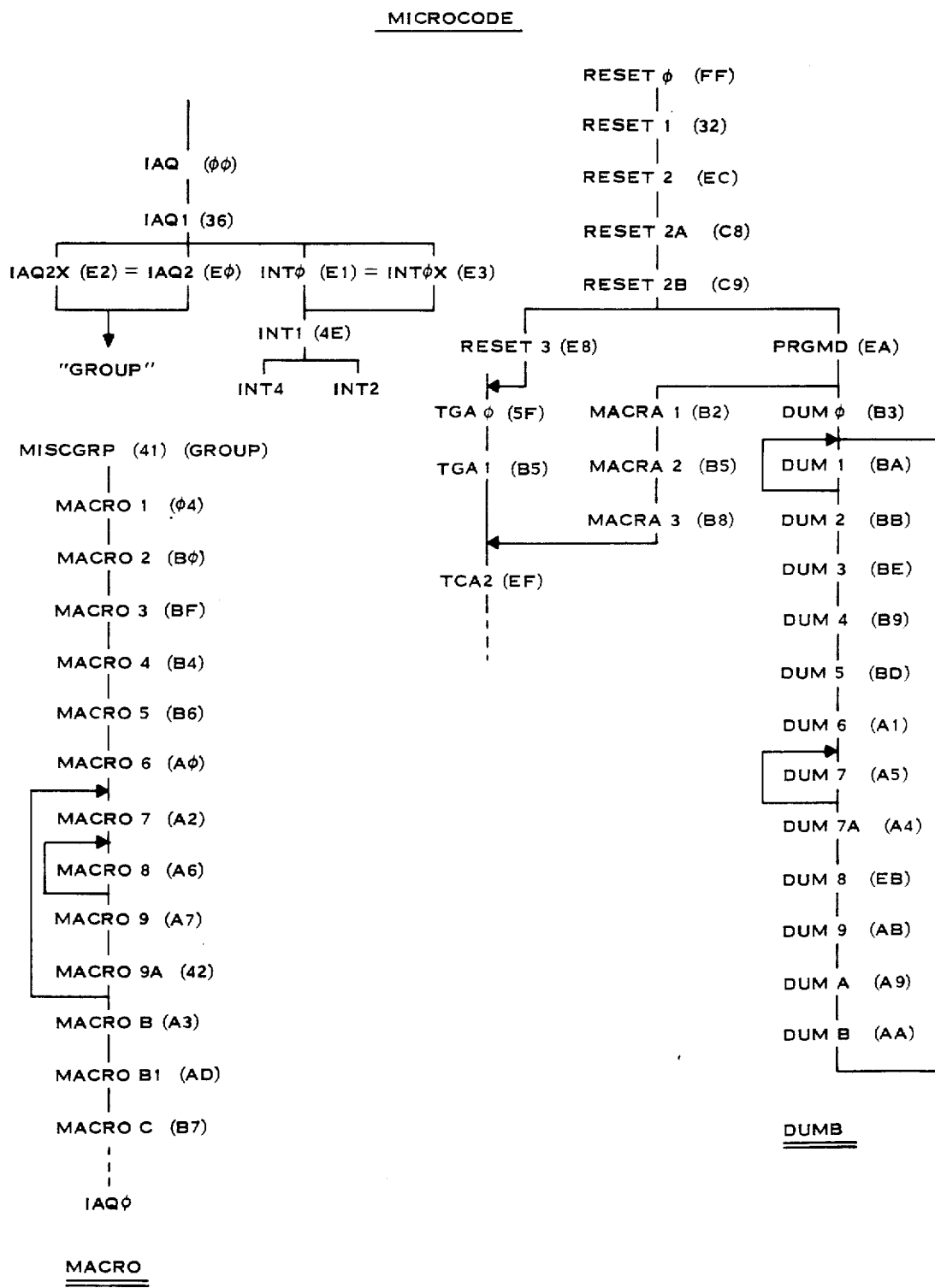
FIG. 6 is a microcode flowchart for the microcomputer illustrating both the dumb mode and macro mode.

FIG. 6 illustrates the microcode flow for the macro and dumb modes. Turning attention to the right half of the drawing, when the $\overline{\text{RESET}}$ signal is activated, the RESET microcode sequence 0 through RESET 2b is executed. After RESET 2b has been executed, a determination is made if the high voltage is present at the Vpp terminal. If the high voltage is present, then the PRG MD (EA) microcode sequence is executed; if not, the RESET 3 (EA) is executed. If no high voltage is present, then the program is simply reset and loads the vector. However, if the high voltage has been set, then the computer must determine whether it is to enter the macro code or the dumb mode. This is done by examining the 7th position of the A port. If the 7th position is a 1, then the DUM sequence will be executed. If the 7th position is a 0, then the MACRA 1 through MACRA 3 sequence will be executed which changes the reset vector from FFFE and FFFF to EFFE and EFFF. In addition, the microcomputer is placed into a memory expansion architecture where the microcomputer can access the off-chip memory. Upon completion of the MACRA microcode sequence, the computer returns to normal microcode sequencing.

Figure 7A:
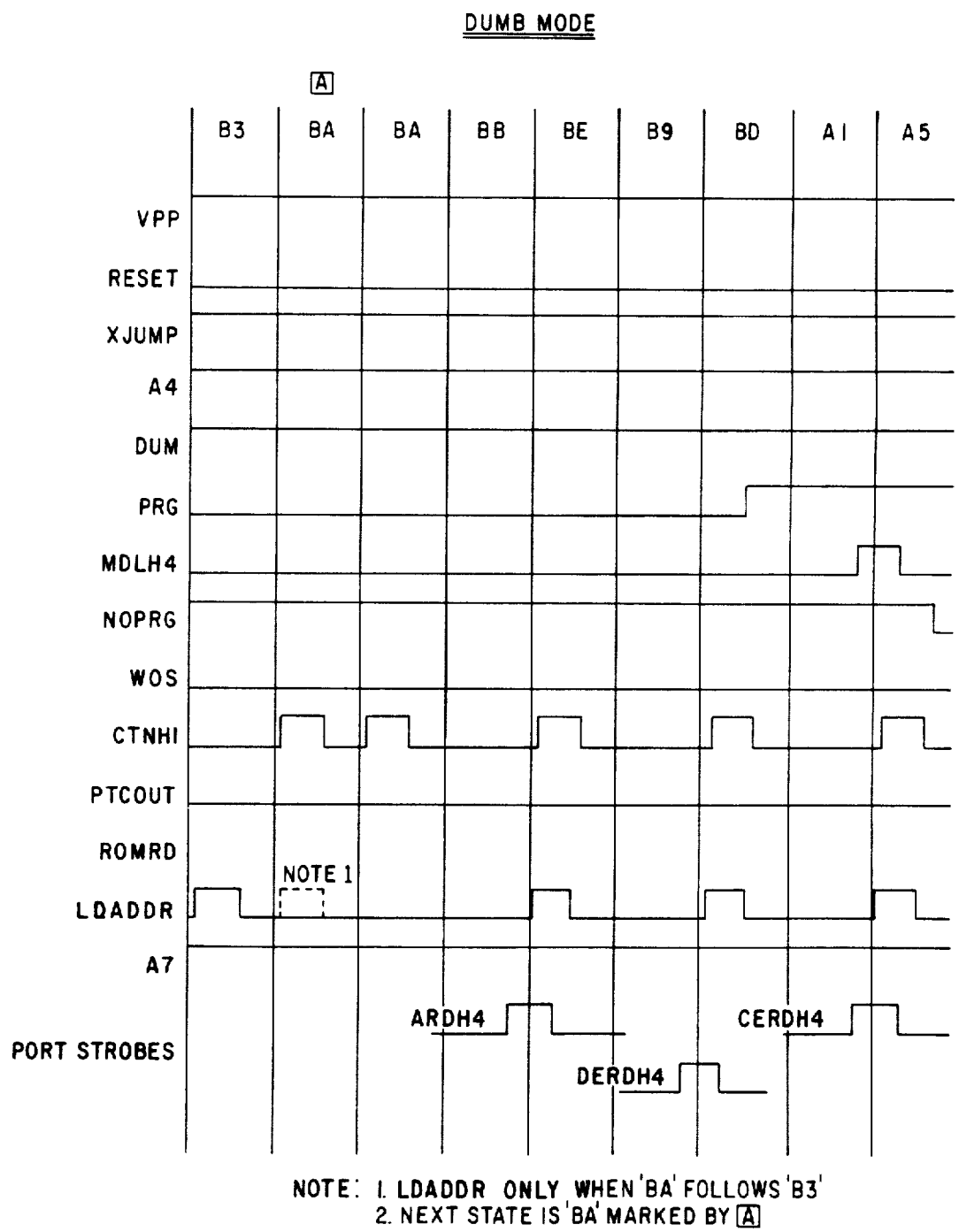
FIG. 7 made up of FIGS. 7a and 7b is a timing diagram illustrating the execution of the dumb mode in microcode.
Figure 7B:
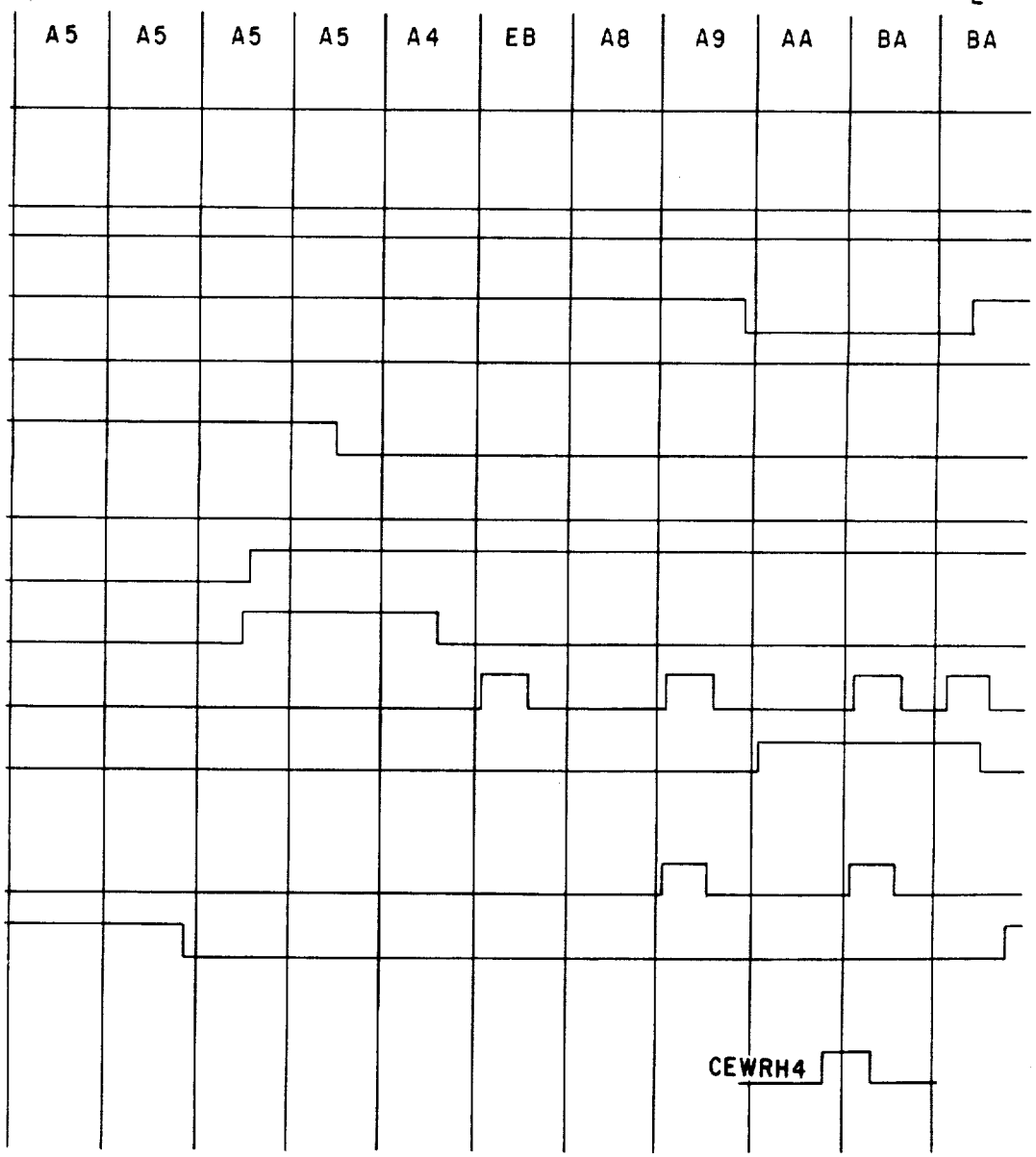

The execution of the DUM microcode sequence is illustrated in FIGS. 6 and 7. In the first state DUM 1, shown in the BA column in FIG. 7, the control line CNTH1 which provides a precharge pulse to the EPROM goes high and for the first execution of BA after DUM 0, the load address signal becomes high. During this time, the A port (A7) position is read. The sequence continues the reading of the A port (D-3) as shown by signal ARDH4 in FIG. 7. This completes the read of the most significant of the bits of the address. This is followed by a reading of the D port which contains the least significant bit positions of the address illustrated by DUM 4 and DUM 5. DUM 6 initiates the data read requiring both a precharge from CTNH1 and the load address signal on LDADDR. Note that D7 continues until the PD/PGM signal goes low to signify a WRITE as shown in FIG. 7. This loop is required so that the data is properly programmed into the EPROM. WOS then becomes high to discharge the EPROM after the high voltage write. The sequencing DUM 7a through DUM B illustrates the completion of the write and the validation or verification of data input. This is shown by the port strobe CEWRH4 which outputs the data at the appropriate address on the C port as previously explained.

Figure 8A:
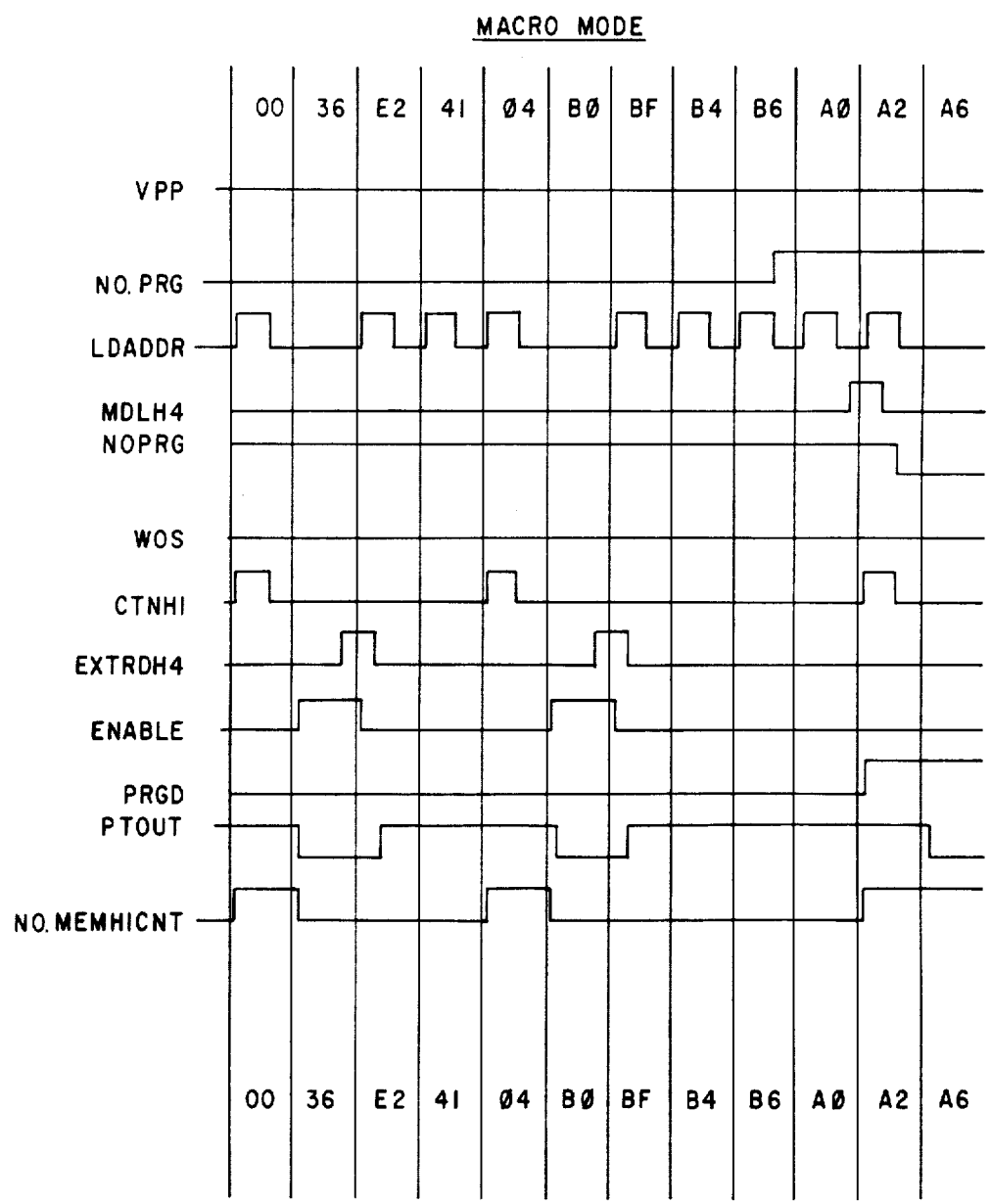
FIG. 8 made up of FIGS. 8a and 8b is a timing diagram representing the execution of the microcode for the macro mode.
Figure 8B:
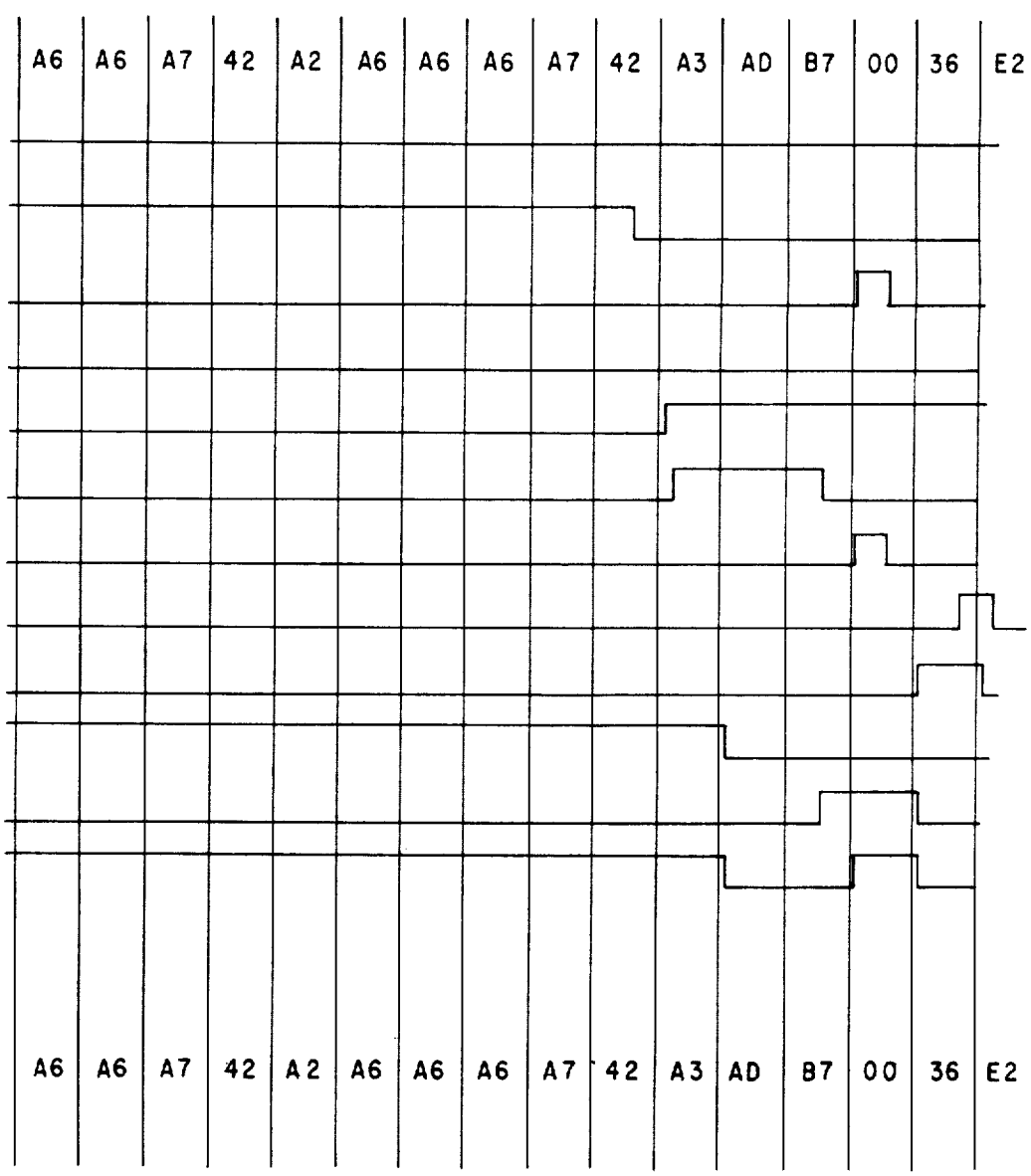

FIGS. 6 and 8 illistrates the execution of the microcode sequence MACRO 1 through MACRO C. It should be noted that the execution of this sequence occurs when the PRG instruction is executed. For the proper programming of internal EPROM this microcode instruction sequence should be executed twice. The first set of microinstructions, MACRO 1 through MACRO 6, establish the indirect addressing of the information to be written into the EPROM. The loop MACRO 7 through MACRO 9 and the loop MACRO 8 are software timing loops executed while the data is written to the EPROM byte positions. The final set of code MACRO B through MACRO C provides the discharge of the high voltage from the EPROM. There is no verify sequence for the MACRO mode because verification may be accomplished by a software read and compare by the program being executed.

Referring now to FIG. 8, the PRG signal is shown occurring when the Vpp power is high. The load address LDADDR signal occurs during the microcode sequence. MDLH4 provides a pulse to load the MD latch which contains the data to be written into the EPROM. The NOPRG signal is a no program signal that actually initiates the writing of the bit positions in the EPROM while isolating the X, Y, and Z decode. WOS provides the discharge of the high voltage after no program NOPRG goes high. This removes any remaining voltage in the memory matrix.

The remaining microflow shown at the top left portion of FIG. 6 illustrates that during execution of instructions is micro-mode, an interrupt jump executed after IAQ1 will cause either 1 of 4 states to be executed. If a high voltage is present, (Vpp), then IAQ2X or INT2X will follow and the microcomputer is in MACRO mode. If no high voltage is present, then IAQ2 or INT2 will follow and the microcomputer is in the normal operating mode. It should be noted that all the microcode discussed connects with a normal micro-mode sequencing in the microcomputer. The remainder of the microcode sequencing is illustrated in U.S. patent application No. 253,642 (TI-8625).

EPROM STRUCTURE

Figure 9:
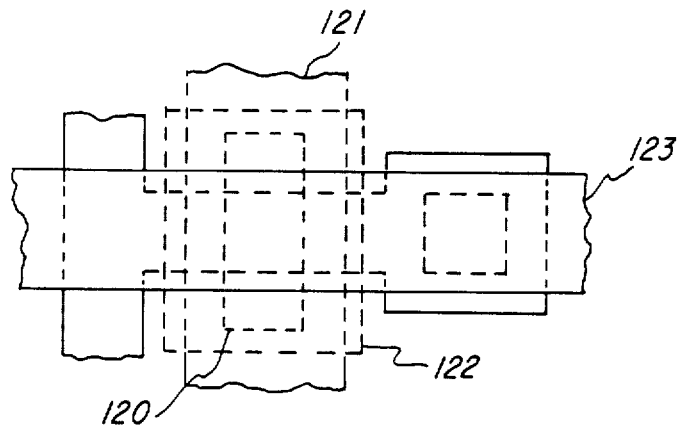
FIG. 9 is a top view of the EPROM memory element.

FIG. 9 illustrates a top view of the EPROM bit gate layout. The EPROM gate structure consists of two gates, the first gate 120 is located above the channel on top of a clean oxide and is isolated from the second gate 121 which is located above the first gate 120. Gate 120 is referred to as a floating gate. The region below the gate 122 is a P+ enhanced region. The gate structure is covered by a metal strip 123.

Figure 10:
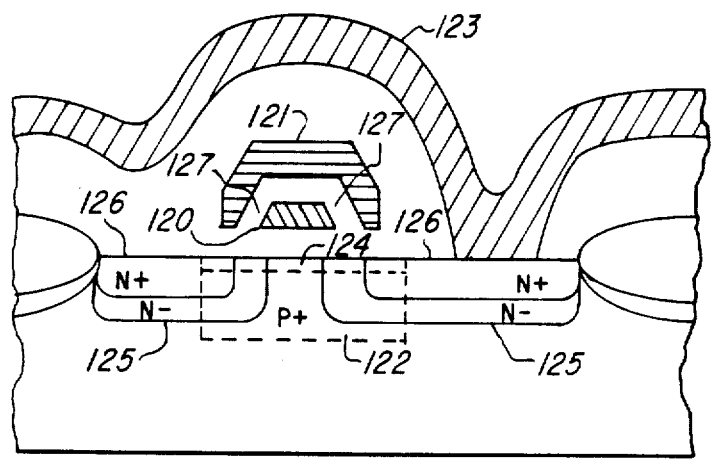
FIG. 10 is a side, cross-sectional view of the EPROM memory element.

FIG. 10 illustrates a side cross sectional view of the bit layout. The floating gate 120 is located 800 angstroms above the channel region 124. Isolation oxide region 127 that is 1100 angstroms thick is located on top of the floating gate 120 and underneath the second polygate 121. The FAMOS device includes source and drain regions 125. An enhanced N+ region 126 is implanted to give the device a higher breakdown voltage. The P+ tank region 122 is a P+ implant underneath the floating gate 120. When the cell is to be programmed, a high voltage is applied to the second polysilicon gate 121 and to the drain 126. The source region 127 is grounded. The effect of this configuration is to cause electrons to collect at the bottom of the floating gate 120, thus causing the channel 124 to become a P type region. Once programmed, this gate will not discharge during a read sequence. To erase the programmed bits, the device is exposed to an ultraviolet light which strips away the electrons from beneath the floating gate 120.

Figure 11:
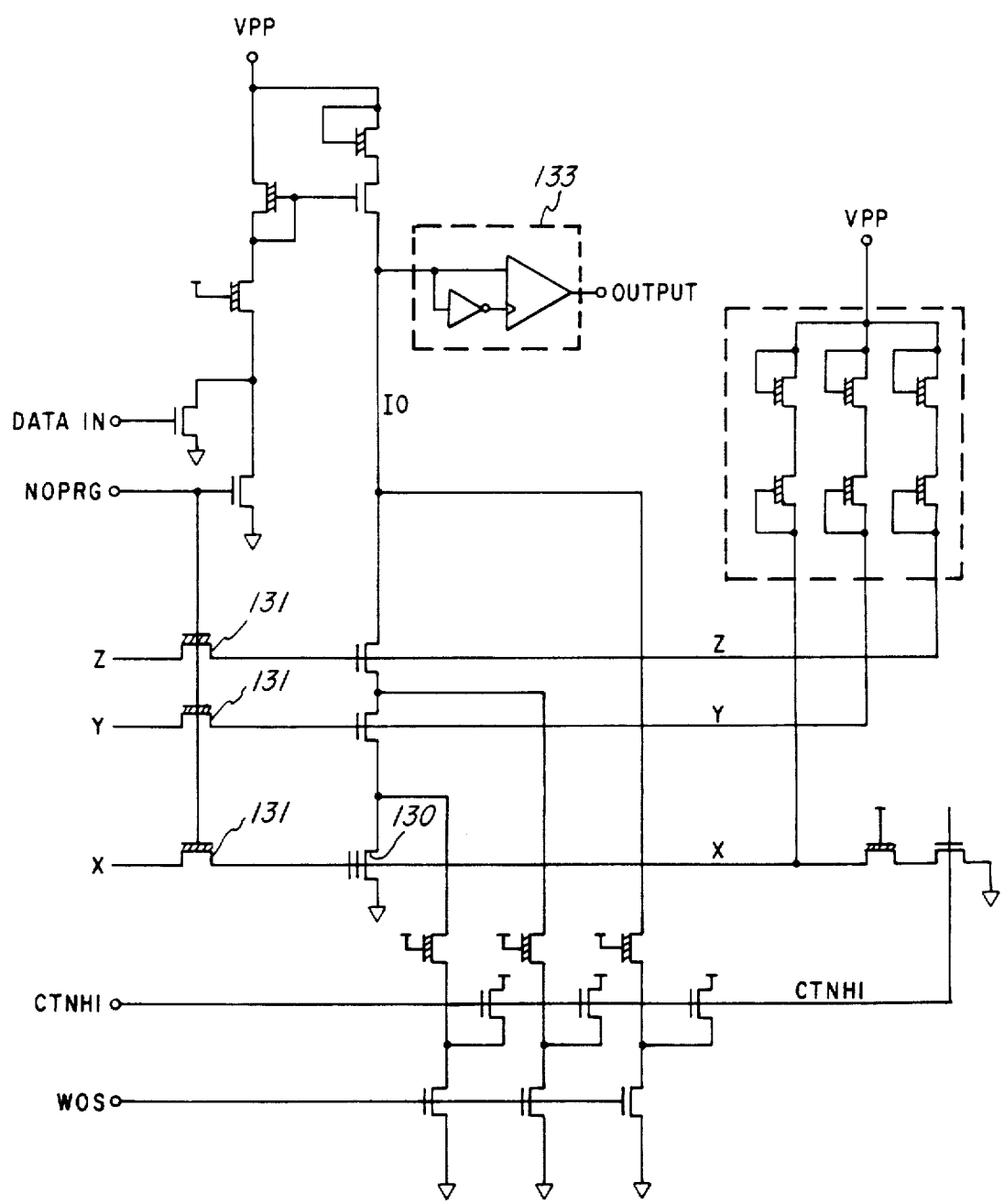
FIG. 11 is a schematic drawing of a single EPROM memory element with the associated control and address circuit.

FIG. 11 illustrates the decoding circuit and control circuit for a single bit 130. Device 131 is provided to isolate the access of the X, Y and Z decoder and multiplexer. Circuit 132 is provided to current limit any current to the bit 130 during the writing of this bit position. The application of Vpp to the bit position is controlled by the DATA IN and NOPRG lines as shown. Also provided is the control signal CTNH1 and WOS.

Figure 12:
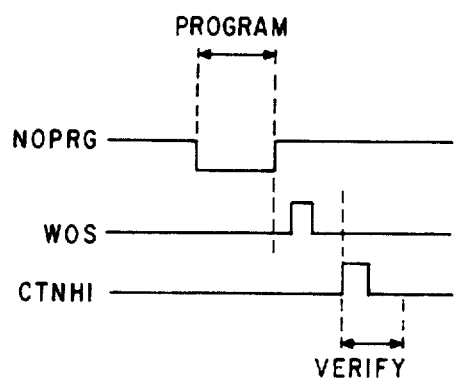
FIG. 12 is a simple timing diagram for the circuit in FIG. 11.

A simplified timing diagram is shown in FIG. 12. During NOPRG being low, the Vpp voltage is applied to the device 130. During the signal WOS, there is a high voltage discharge provided to discharge any remaining high voltage from the bit lines after NOPRG goes high. The CTNH1 signal provides a pulse to precharge initially the nodes in order that they may be read. All bit lines are precharged to 25 volts. When addressed, if any bit lines contain any addressed unprogrammed but devices, the bit line is discharged producing a voltage of approximately 1 volt. Because the voltage difference between the discharged and undischarged bit line is approximately a volt, the output sensing circuit 133 is relatively simple as shown. If the bit has not been programmed, then the bit node will discharge when the gate of device 130 becomes active when the appropriate X, Y and Z decoding circuit lines are activated through device 131. Upon precharging the bit node, device 130 will discharge the bit node when the decoding circuit becomes active. Therefore, the MD bus will be discharged. However, if the gate has been programmed and the device is addressed, then the node will remain charged and will output a voltage of about two volts to the sensing circuit 133 and the MD bus will not be discharged.

Figure 13A:
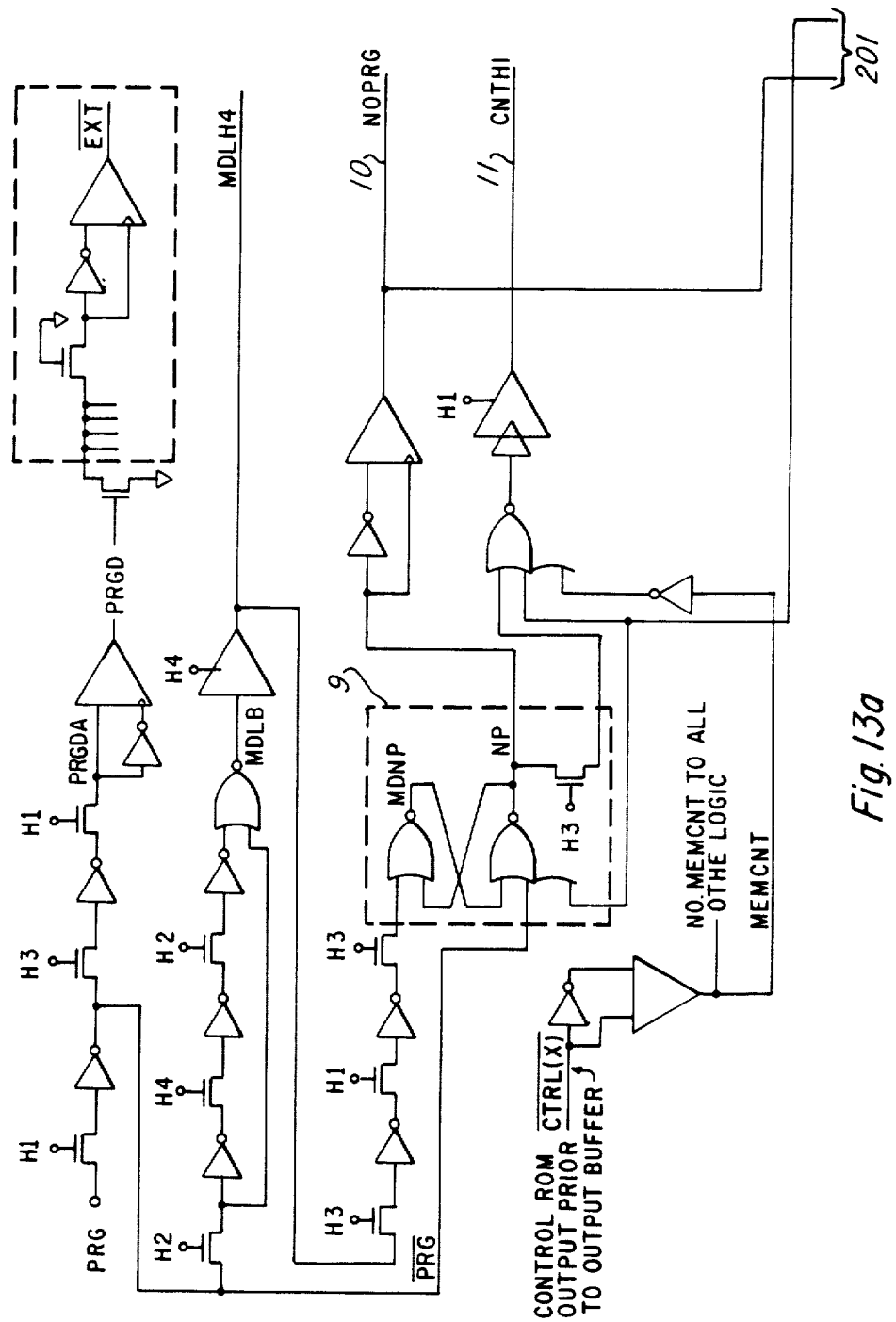
FIG. 13 made up of FIGS. 13a, 13b and 13c is a schematic diagram of the circuit that produces the control signals for the EPROM.
Figure 13B:
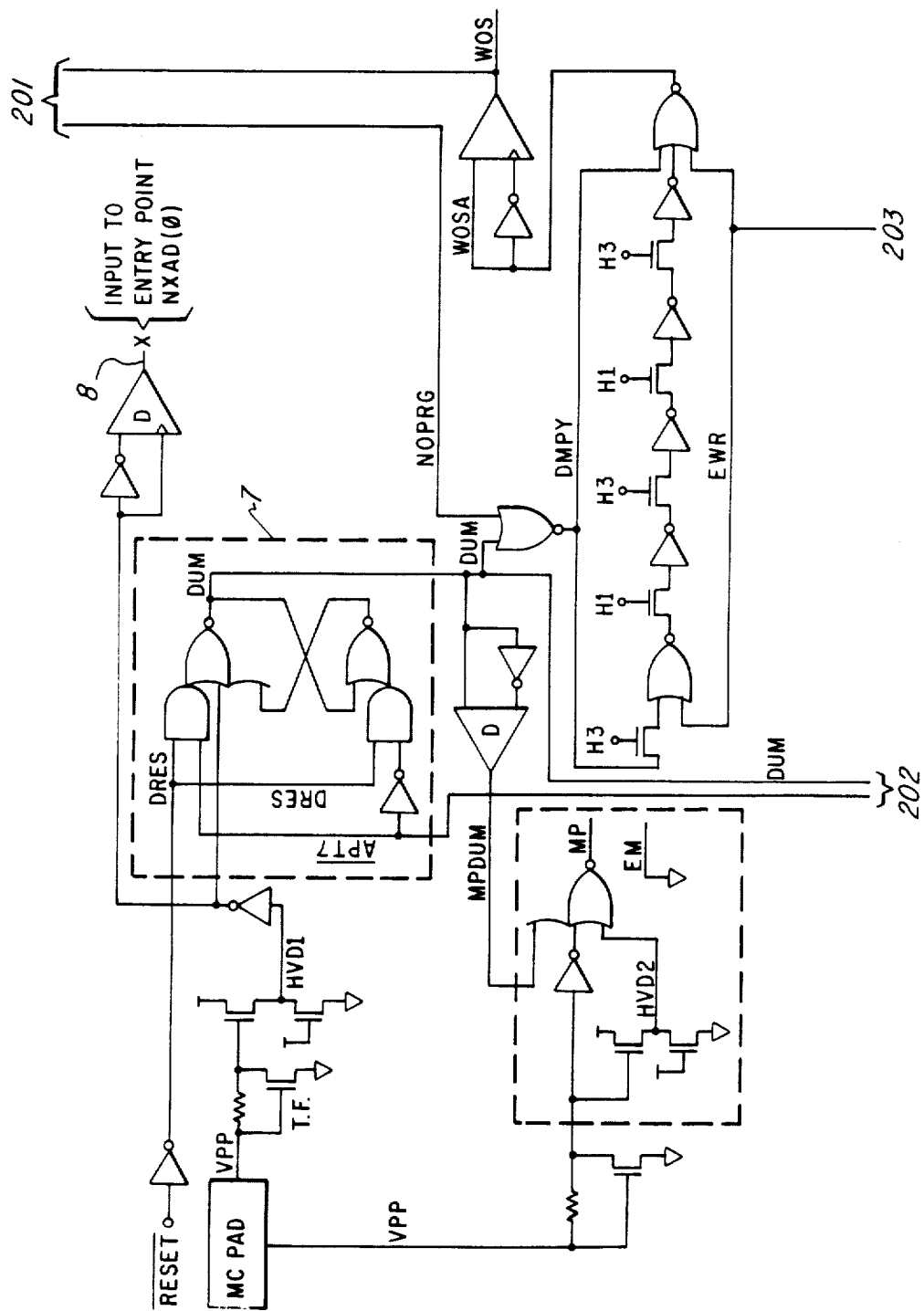
Figure 13C:
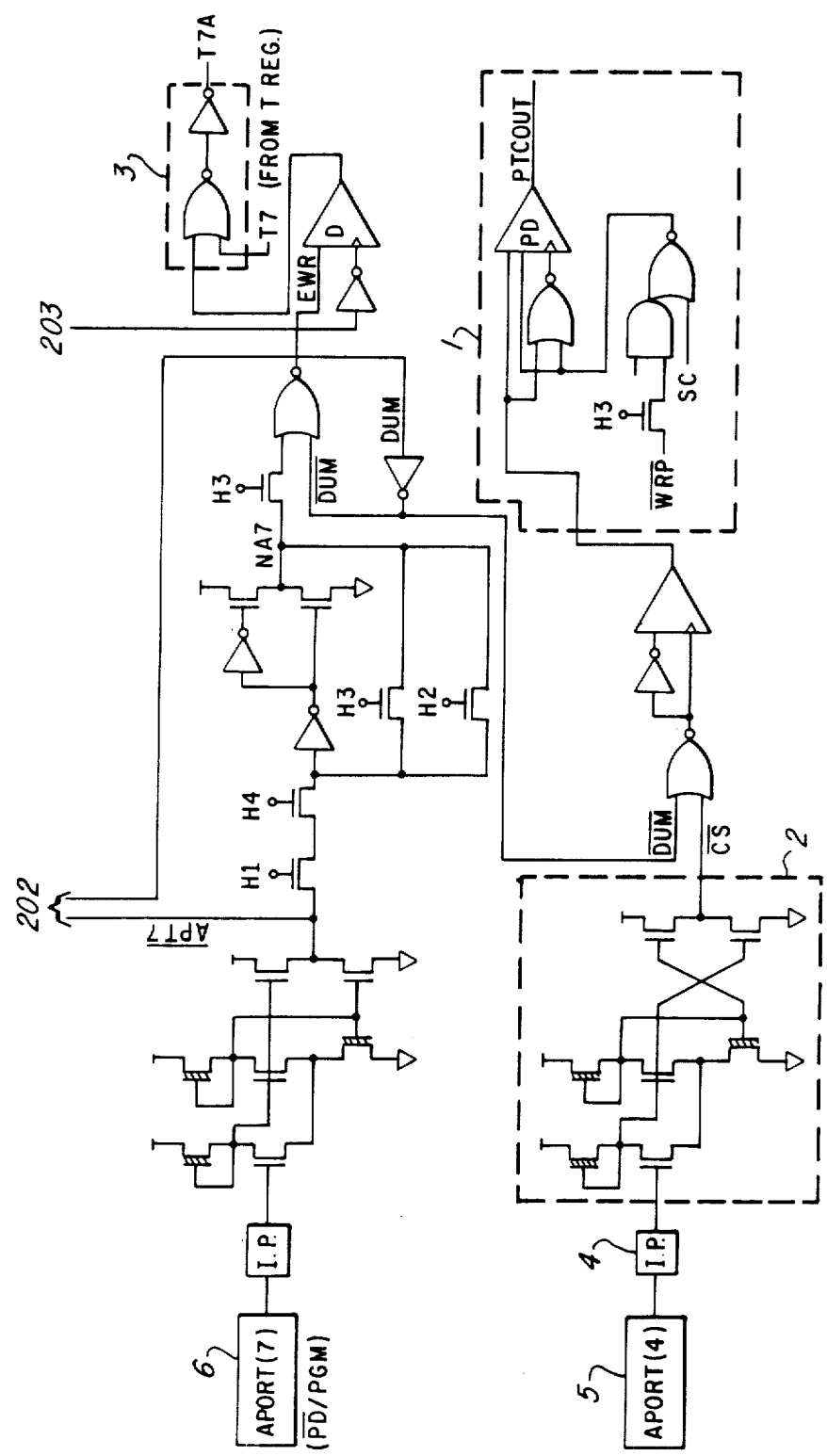

FIG. 13 illustrates the schematics of the circuits that produce the control signals for the EPROM. Signals received by A port position 7 and A port position 4 are illustrated as pads 6 and 5, respectively. Referring to pad 5, the signal is received and is inputted through input protection circuit 4 which protects the input circuit in the microcomputer from high static voltage and includes Zener diode in a thick field device. Circuit 2 is provided as a Schmitt trigger. The Schmitt trigger 2 provides TTL compatibility for the $\overline{CS}$ signal. The $\overline{CS}$ signal is used to produce the PTCOUT signal to signify to the C port that it is in the output mode. This signal is ORd with the $\overline{DUM}$ signal provided from DUM latch 7. Note that the $\overline{PDPGM}$ signal is used by the circuit connected to A port (7) to also produce the signal T7A to be used by the microprogramming flow circuit to provide the timing loop for the write in the dumb mode. The high voltage Vpp is applied to the MC pad and is used in DUM latch 7 to indicate that high voltage has been applied. This latch stays set until reset. This signal is also used by the circuit 8 to provide data for execution of the correct microcode sequencing as previously discussed in FIG. 6. The NOPRG and CTNH1 signals are produced from the execution of the #PRG microcode instruction. The WOS signal used to discharge the high voltage from the memory matrix is produced from the Vpp input. The circuit for the NOPRG signal includes a latch 9 that is to provide NOPRG for a sufficient time to write the data into the bit position.

Figure 14A:
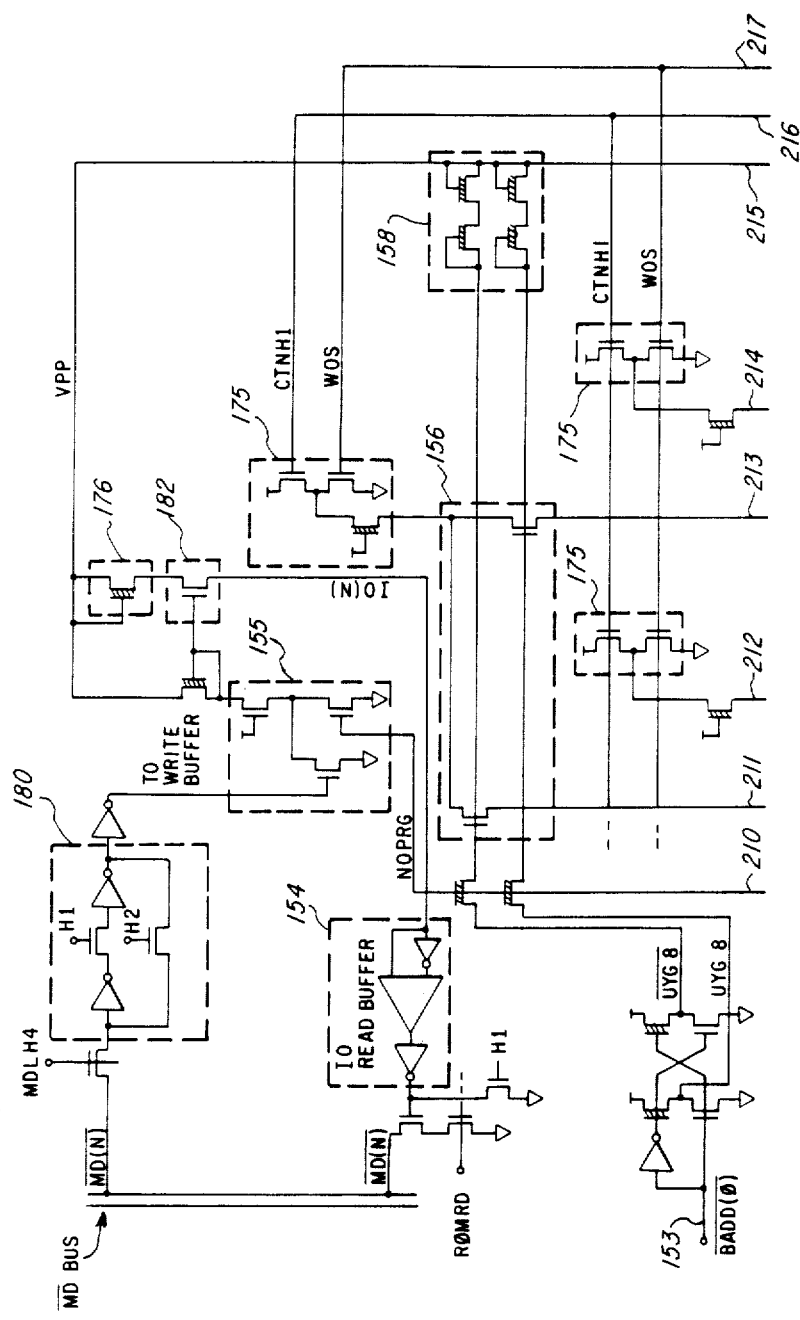
FIG. 14 made up of FIGS. 14a, 14b and 14c is a schematic diagram of a byte of EPROM memory with its associated input/output circuit and addressing circuit.
Figure 14B:
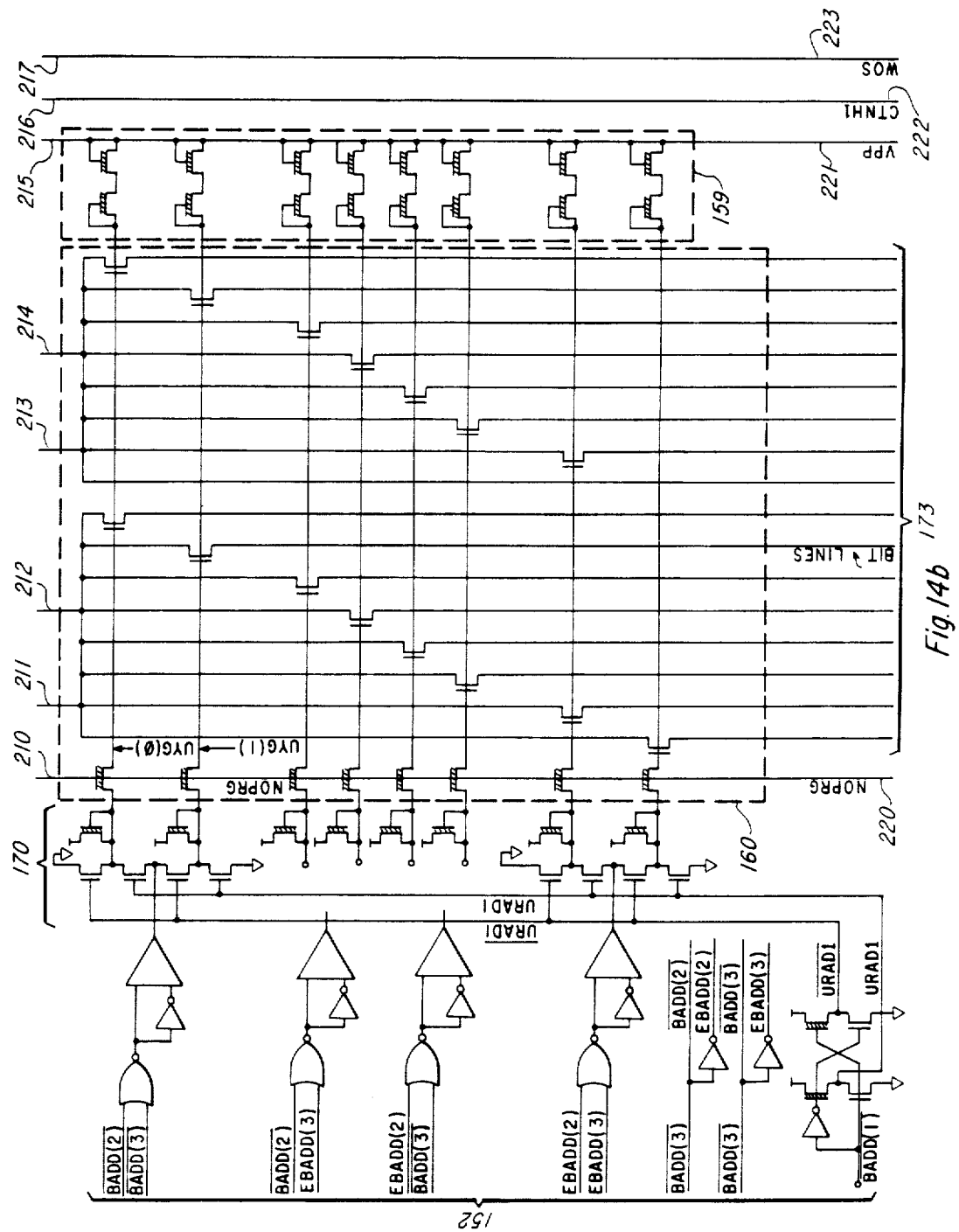
Figure 14C:
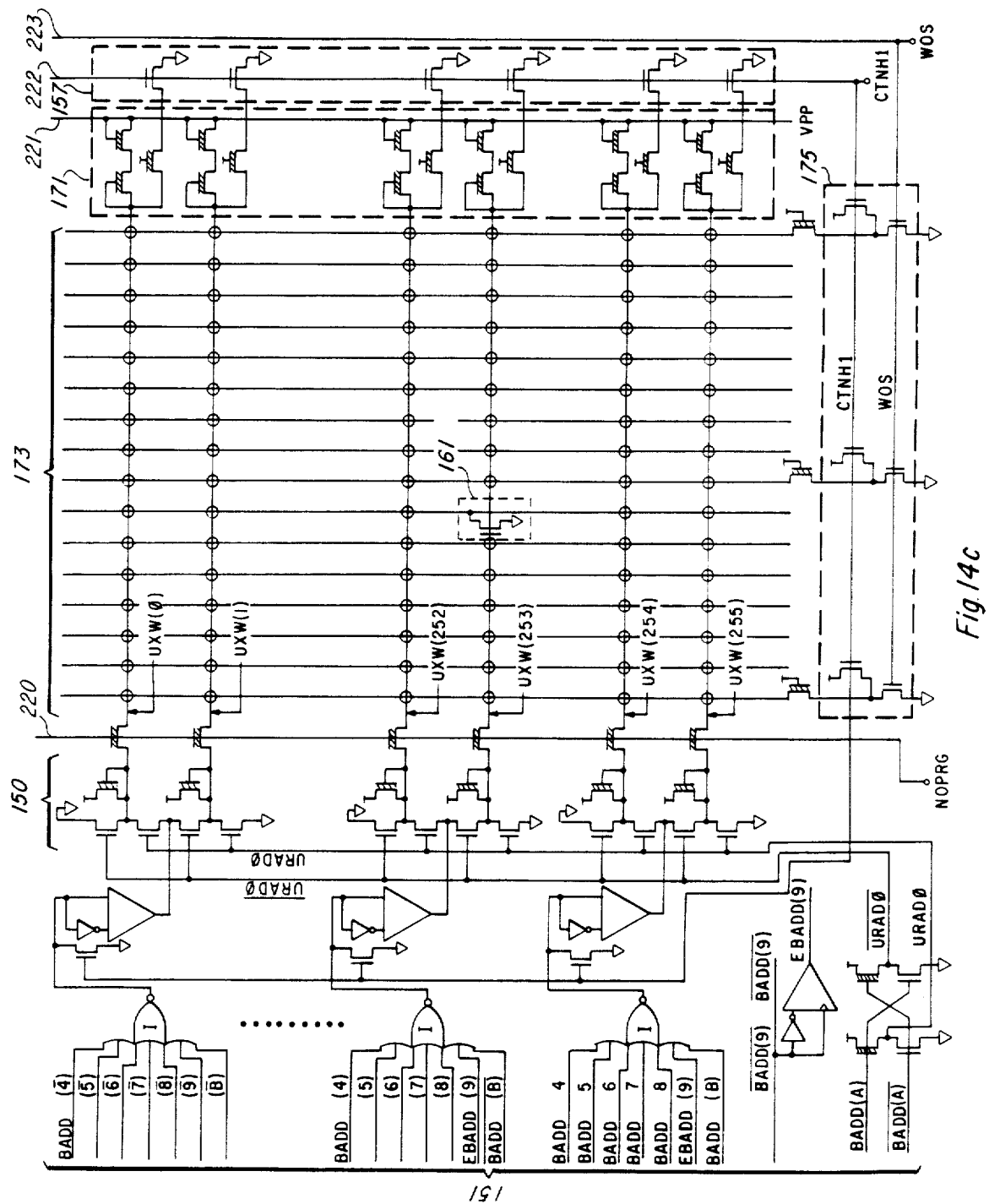

A schematic of the memory array is shown in FIG. 14. This illustrates one bit out of a byte for the 4096 bits in the array. The X address decoding circuit 151, Y address decoding circuit 152 and Z address decoding circuit 153 is illustrated connecting to multiplex circuit 150 for the X address 151; multiplex circuit 170 connects to the Y address circuit 152 and the Z address connected directly to the array. The addressing for this array is similar to the addressing for any normal EPROM. The bit lines are addressed by the Y and Z portion of the address word while the floating gate is addressed by the X portion. The actual select circuit for Z address is shown at 156 and the Y select circuit is illustrated in the circuit for 157. Current limiting circuit 159 is connected to the Y decode circuit 157 to limit the amount of current provided to the bit during the programming mode by the voltage Vpp. The same current limiting circuit 158 is applied to Z decoding circuit 156 and likewise, once the current limiting circuit 171 is coupled to the X address circuit in the array 173. The array 173 contains all the floating gate cells, such as 161 for the byte addresses. The control lines CTNH1 and WOS are connected to the arrays via circuits 157 and 175. The CTNH1 device in circuit 157 discharges the X address circuit. The CTNH1 device in circuit 175 provides the 2.5 volt precharge for 200 NS. The reading sequence is for 600 NS. The fact that the cells are precharged results in the discharge for a bit read of approximately 1 volt. Therefore, the sense amplifier in circuit 154 is much simpler than a normal sense amplifier for an EPROM. Circuit 159 is a transistor standard beta ratio pushpull inverter. In the prior art, the sense amplifiers to read the bit locations in EPROM were normally multiple stage differential amplifiers in order to detect millivolt ranges; however, with the voltage from the EPROM circuit being in the range of 1 volt only a simple amplifier is required. The programming of the array by the voltage Vpp is controlled by the no program control signal and the MD bus at circuit 155. Latch 180 stores the data to be written. The output of Latch 180 and NOPRG are inputted to circuit 155 to control the high voltage switch 182. Device 176 is a depletion device which prevents Vpp from degrading the breakdown voltage of device 182 in the array.

What we claim is:

1. A programmable read-only memory comprising: a semiconductor substrate means for containing the programmable read-only memory, the programmable read-only memory includes:
   a read-only memory array means containing a plurality of program instruction at addressable locations;
   means for altering a predetermined program instruction including;
   a microprocessor means for processing program instructions and to provide control signals for altering the predetermined program instruction;
   address means for addressing a predetermined location in the read-only memory array means containing the program instructions to be altered;
   a latch means for storing an altered program instruction and to apply the altered program instructions to the read-only memory array means at the addressed location;
   high voltage means for providing a high voltage to the address location for storing the altered program instruction in the read-only memory array means; and
   output means for providing a precharge signal to the memory array means to obtain the program instructions for processing by the microprocessor means, said address means, data latch means, high voltage means and output means being controlled by the control signals.

2. An electrically programmable read-only memory according to claim 1, wherein said high voltage means discharges the high voltage from the read-only memory array means after the storing therein of the altered programmed instruction.

3. The electrically programmable read-only memory according to claim 2, wherein the precharge signal occurs after the discharge.

4. The electrically programmable read-only memory according to claim 3, wherein said high voltage means includes current limiting devices to protect the devices contained in said read-only memory array, said address means and said output means.

* * * * *